(12) United States Patent
Du

(10) Patent No.: US 12,211,309 B2
(45) Date of Patent: Jan. 28, 2025

(54) ULTRASONIC FINGERPRINT DETECTION DEVICE AND ELECTRONIC DEVICE

(71) Applicant: HUIKE (SINGAPORE) HOLDING PTE. LTD., Singapore (SG)

(72) Inventor: Canhong Du, Guangdong (CN)

(73) Assignee: HUIKE (SINGAPORE) HOLDING PTE.LTD., Singapore (SG)

(*) Notice: Subject to any disclaimer, the term of this patent is extended or adjusted under 35 U.S.C. 154(b) by 0 days.

(21) Appl. No.: 18/455,554

(22) Filed: Aug. 24, 2023

(65) Prior Publication Data

US 2024/0021008 A1 Jan. 18, 2024

Related U.S. Application Data

(63) Continuation of application No. PCT/CN2022/105775, filed on Jul. 14, 2022.

(51) Int. Cl.
*G06V 40/13* (2022.01)
*H03M 1/12* (2006.01)

(52) U.S. Cl.
CPC .......... *G06V 40/1306* (2022.01); *H03M 1/12* (2013.01)

(58) Field of Classification Search
CPC .................................. G06F 3/043; G06B 1/02
See application file for complete search history.

(56) References Cited

U.S. PATENT DOCUMENTS 5,380,959 A * 1/1995 Knowles ............... G06F 3/0436
178/20.01
10,410,034 B2 9/2019 Strohmann et al.
(Continued)

FOREIGN PATENT DOCUMENTS

CN 86105197 A 4/1987
CN 1462572 A 12/2003
(Continued)

OTHER PUBLICATIONS

PENG Yong-long. Damping of LC oscillation using a hybrid combination approach for three-phase BUCK-type SVPWM rectifier (Power System Protection and Control. vol. 42 No. 1), Dec. 26, 2013. 6 pages.
(Continued)

*Primary Examiner* — Joseph R Haley
(74) *Attorney, Agent, or Firm* — Scully, Scott, Murphy & Presser, P.C.

(57) ABSTRACT

An ultrasonic fingerprint detection device and an electronic device are provided, which can reduce the size, circuit complexity and cost of the ultrasonic fingerprint detection device. The ultrasonic fingerprint detection device includes: a signal generation circuit and an ultrasonic fingerprint sensor chip, where the signal generation circuit is composed of discrete devices and the signal generation circuit includes: a control circuit and a resonant circuit, the control circuit is configured to receive a control signal provided by the ultrasonic fingerprint sensor chip and generate an excitation signal under the action of the control signal, and the resonant circuit is configured to receive the excitation signal and form a drive signal under the action of the excitation signal; and the ultrasonic fingerprint sensor chip is configured to receive the drive signal, and generate an ultrasonic signal for fingerprint detection under the action of the drive signal.

17 Claims, 7 Drawing Sheets

(56) References Cited

U.S. PATENT DOCUMENTS

| | | | |
|---|---|---|---|
| 11,404,787 B2 | 8/2022 | Kurokawa | |
| 2006/0215028 A1 | 9/2006 | Abe et al. | |
| 2008/0100937 A1 | 5/2008 | Farrell | |
| 2011/0025649 A1* | 2/2011 | Sheikhzadeh Nadjar | G06F 3/043 178/20.01 |
| 2011/0102114 A1* | 5/2011 | Reiche | H03J 3/20 333/81 R |
| 2015/0016223 A1* | 1/2015 | Dickinson | G06F 3/043 367/87 |
| 2018/0129849 A1 | 5/2018 | Strohmann et al. | |
| 2019/0026521 A1* | 1/2019 | Du | G06V 40/1306 |
| 2020/0036096 A1 | 1/2020 | Kurokawa | |
| 2021/0239553 A1 | 8/2021 | Akhbari et al. | |
| 2022/0139102 A1* | 5/2022 | Zhang | G06V 40/1306 382/124 |

FOREIGN PATENT DOCUMENTS

| | | |
|---|---|---|
| CN | 1486126 A | 3/2004 |
| CN | 101145728 A | 3/2008 |
| CN | 101540627 A | 9/2009 |
| CN | 101585459 A | 11/2009 |
| CN | 101807864 A | 8/2010 |
| CN | 101817471 A | 9/2010 |
| CN | 101819184 A | 9/2010 |
| CN | 202424494 U | 9/2012 |
| CN | 103052200 A | 4/2013 |
| CN | 103107803 A | 5/2013 |
| CN | 203339946 U | 12/2013 |
| CN | 103731166 A | 4/2014 |
| CN | 104135274 A | 11/2014 |
| CN | 104145393 A | 11/2014 |
| CN | 104734516 A | 6/2015 |
| CN | 104935198 A | 9/2015 |
| CN | 106251548 A | 12/2016 |
| CN | 107491774 A | 12/2017 |
| CN | 206790358 U | 12/2017 |
| CN | 107659204 A | 2/2018 |
| CN | 109003950 A | 12/2018 |
| CN | 109525226 A | 3/2019 |
| CN | 109883494 A | 6/2019 |
| CN | 109889072 A | 6/2019 |
| CN | 110506364 A | 11/2019 |
| CN | 110560347 A | 12/2019 |
| CN | 210005688 U | 1/2020 |
| CN | 111523436 A | 8/2020 |
| CN | 112181213 A | 1/2021 |
| CN | 112580534 A | 3/2021 |
| CN | 113158737 A | 7/2021 |
| CN | 213754334 U | 7/2021 |
| CN | 113343800 A | 9/2021 |
| CN | 114188928 A | 3/2022 |
| CN | 114749359 A | 7/2022 |
| CN | 115188034 A | 10/2022 |
| JP | H08337363 A | 12/1996 |
| JP | H1179567 A | 3/1999 |
| JP | 2004336875 A | 11/2004 |
| JP | 2015190817 A | 11/2015 |
| KR | 20190087339 A | 7/2019 |
| WO | 2013110391 A1 | 8/2013 |

OTHER PUBLICATIONS

Wei, S., "Development of the digital ultrasonic rangefinder", Guangxi Hydraulic and Electric Polytechnic, Oct. 2009, pp. 39-41, vol. 17, No. 10.

* cited by examiner

ULTRASONIC FINGERPRINT DETECTION DEVICE AND ELECTRONIC DEVICE

CROSS-REFERENCE TO RELATED APPLICATION

This application is a continuation of International Application No. PCT/CN2022/105775, filed on Jul. 14, 2022, the disclosure of which is hereby incorporated by reference in its entirety.

TECHNICAL FIELD

The present application relates to the technical field of fingerprint detection, and more specifically, to an ultrasonic fingerprint detection device and an electronic device.

BACKGROUND

With the development and progress of science and technology, fingerprint detection technology is increasingly applied to smart terminal devices such as mobile phones and computers, so as to improve people's experience in using the smart terminal devices.

In some commercial solutions of ultrasonic fingerprint detection technology, fingerprint detection can be realized through two chip structures. One chip is a transmitting chip configured to generate a high-voltage drive signal, and the other chip is a receiving chip configured to receive the high-voltage drive signal and emit ultrasonic waves to a finger so as to detect a fingerprint of the finger. In this technical solution, a "dual-chip" architecture means large size, complicated circuit and high cost.

In view of this, how to reduce the size, circuit complexity and cost of an ultrasonic fingerprint detection device is an urgent technical problem to be solved.

SUMMARY

The present application provides an ultrasonic fingerprint detection device and an electronic device, which could reduce the size, circuit complexity and cost of the ultrasonic fingerprint detection device.

In a first aspect, there is provided an ultrasonic fingerprint detection device, including: a signal generation circuit and an ultrasonic fingerprint sensor chip, where the signal generation circuit is composed of discrete devices and the signal generation circuit includes: a control circuit and a resonant circuit, the control circuit is configured to receive a control signal provided by the ultrasonic fingerprint sensor chip and generate an excitation signal under the action of the control signal, and the resonant circuit is configured to receive the excitation signal and form a drive signal under the action of the excitation signal; and the ultrasonic fingerprint sensor chip is configured to receive the drive signal, and generate an ultrasonic signal for fingerprint detection under the action of the drive signal.

Through the technical solution of the embodiment of the present application, there is provided an ultrasonic fingerprint detection device with a "single-chip" architecture that includes an ultrasonic fingerprint sensor chip and a signal generation circuit composed of discrete devices. The signal generation circuit includes a control circuit and a resonant circuit, where the resonant circuit has a relatively simple circuit structure and is easy to implement and control, so that a good boosting effect can be achieved. In addition, the control circuit may obtain a control signal from the ultrasonic fingerprint sensor chip without the need to obtain the control signal from other external control devices. Therefore, the ultrasonic fingerprint detection device of the embodiment of the present application has a relatively simple circuit structure, a relatively small circuit area and a relatively low manufacturing cost.

In some possible implementation manners, the control circuit includes two switching transistors connected in series between an input power supply and ground, and the two switching transistors are alternatively turned on under the action of the control signal to generate a pulse excitation signal; and the resonant circuit includes a capacitor and an inductor connected in series between the control circuit and the ground, and the capacitor and the inductor resonate under the action of the pulse excitation signal to generate a sine wave drive signal.

In some possible implementation manners, a switching transistor of the two switching transistors connected to the input power supply is a PMOS transistor, and a switching transistor of the two switching transistors connected to the ground is an NMOS transistor.

Through the technical solution of the implementation manners, a switching transistor in the signal generation circuit connected to the input power supply is set as a PMOS transistor, and a switching transistor connected to the ground is set as an NMOS transistor. In the case that an input power supply of the ultrasonic fingerprint sensor chip and an input power supply of the signal generation circuit are the same power supply, the control signal provided by the ultrasonic fingerprint sensor chip can realize the effective control of the two switching transistors effectively without other additional circuits and signals to drive and control the two switching transistors. The signal generation circuit is low in circuit structure complexity and manufacturing cost.

In some possible implementation manners, during a process of alternately turning on the two switching transistors, after a state of one of the two switching transistors is changed from turn-on to turn-off followed by a preset time, a state of the other of the two switching transistors is changed from turn-off to turn-on.

Through the technical solution of the implementation manners, it can be ensured that the two switching transistors are not turned on at the same time so as not to cause a large current to be introduced into the two switching transistors, which thus ensures use reliability of the control circuit, and is conducive to improving service life of the control circuit.

In some possible implementation manners, the two switching transistors are also turned on alternately in reverse phase under the action of the control signal to generate a reverse phase pulse excitation signal, and the reverse phase pulse excitation signal is used to damp resonance of the resonant circuit to reduce resonance energy of the sine wave drive signal.

In some possible implementation manners, the signal generation circuit further includes: a brake circuit including a damping resistor that is connected between the resonant circuit and the control circuit.

Through the technical solution of the implementation manners, the brake circuit including the damping resistor is added to the signal generation circuit to absorb redundant signal energy generated by the resonant circuit when it is desired that the resonant circuit stops outputting the wave drive signal, so that residual resonance of the sine wave drive signal output by the resonant circuit is improved, and quality of the drive signal is improved.

In some possible implementation manners, one end of the damping resistor is connected between the resonant circuit and the control circuit, and the other end of the damping resistor is grounded.

In some possible implementation manners, when the control circuit is disconnected, the damping resistor is connected in series between the resonant circuit and ground, and the damping resistor is configured to damp resonance of the resonant circuit to reduce resonance energy of the drive signal.

In the technical solution of the implementation manners, the brake circuit is relatively simple in a circuit structure and relatively low in cost. Through the brake circuit, on the basis of ensuring that the signal generation circuit can output a drive signal of high quality, the overall cost of the signal generation circuit and the ultrasonic fingerprint detection device where the signal generation circuit is located can be further reduced.

In some possible implementation manners, a resistance value of the damping resistor is between 0.8*Z and 2*Z, where Z is a characteristic impedance of the resonant circuit.

In some possible implementation manners, the ultrasonic fingerprint sensor chip includes: a control module, a transducer module and a detection module; the control module is configured to provide the control signal to the signal generation circuit to control the signal generation circuit to generate the drive signal; the transducer module is configured to receive the drive signal to generate an ultrasonic signal, and the ultrasonic signal is reflected by a user finger to generate an echo signal, and the transducer module is configured to convert the echo signal into an electrical signal; and the detection module is configured to detect the electrical signal to detect a fingerprint of the user finger.

In the technical solution of the implementation manners, through the control module in the ultrasonic fingerprint sensor chip, the overall fingerprint detection process of the ultrasonic fingerprint detection device can be uniformly controlled, so as to ensure that the fingerprint detection process is carried out in an orderly manner to ensure a fingerprint detection effect, and a circuit structure of the ultrasonic fingerprint detection device is further simplified, and circuit complexity of the ultrasonic fingerprint detection device is reduced.

In some possible implementation manners, the control module is configured to send the control signal to the signal generation circuit multiple times to control the signal generation circuit to generate a plurality of drive signals; the transducer module is configured to receive the plurality of drive signals to generate a plurality of ultrasonic signals, and convert a plurality of echo signals corresponding to the plurality of ultrasonic signals into a plurality of electrical signals; and the detection module is configured to detect the plurality of electrical signals to detect the fingerprint of the user finger.

Through the technical solution of the implementation manners, "multiple detection" of the fingerprint of the user finger by the ultrasonic fingerprint sensor chip can be realized, and a fingerprint result obtained by the "multiple detection" has higher accuracy, which can improve the fingerprint detection effect of the ultrasonic fingerprint sensor chip.

In some possible implementation manners, the control module is configured to periodically send the control signal to the signal generation circuit to control the signal generation circuit to periodically generate the drive signal; the control module is configured to control the transducer module to periodically receive the drive signal to generate the ultrasonic signal; and the control module is configured to control the detection module to periodically detect the electrical signal to detect the fingerprint of the user finger.

Through the technical solution of the implementation manners, the control module may periodically send the control signal to the signal generation circuit to realize the convenient control of the signal generation circuit, and the control module may also periodically control the transducer module and the detection module to realize the periodic detection of the user fingerprint by the ultrasonic fingerprint sensor chip.

In some possible implementation manners, the detection module includes: a receiving module, a wave detection module and a signal accumulation module; the receiving module is configured to receive the plurality of electrical signals; the wave detection module is configured to detect amplitudes of the plurality of electrical signals; and the signal accumulation module is configured to accumulate the amplitudes of the plurality of the electrical signals to obtain a signal accumulation value, and the signal accumulation value is used to be averaged to detect the fingerprint of the user finger.

Through the technical solution of the implementation manners, after the signal accumulation value obtained by detection of the detection module is averaged, noise in the signal can be reduced, thereby improving a signal-to-noise ratio of fingerprint detection, and further improving fingerprint detection accuracy of the ultrasonic fingerprint sensor chip.

In some possible implementation manners, the signal accumulation module is an analog accumulator.

Through the technical solution of the implementation manners, the analog signal accumulation value can be quickly stored in the signal accumulation module without analog-to-digital conversion. Therefore, a circuit structure of the signal accumulation module is relatively simple, which can reduce circuit complexity of the ultrasonic fingerprint sensor chip.

In some possible implementation manners, the ultrasonic fingerprint sensor chip further includes: a readout module, an analog-to-digital conversion module and an interface module; the readout module is configured to read out the signal accumulation value to the analog-to-digital conversion module; the analog-to-digital conversion module is configured to convert the signal accumulation value into a digital signal; and the interface module is configured to transmit the digital signal to an external device so that the digital signal is averaged to detect the fingerprint of the user finger.

Through the technical solution of the implementation manners, the readout module, the analog-to-digital conversion module and the interface module are set in the ultrasonic fingerprint sensor chip, which can facilitate a digital signal corresponding to the signal accumulation value to be transmitted to an external device of the ultrasonic fingerprint sensor chip to quickly detect the fingerprint of the user finger, so as to improve fingerprint detection efficiency.

In some possible implementation manners, a voltage value of an input power supply of the signal generation circuit is the same as a voltage value of an input power supply of the ultrasonic fingerprint sensor chip.

Through the technical solution of the implementation manners, the ultrasonic fingerprint detection device provided in the embodiment of the present application only needs one power supply, and does not need to be connected to multiple types of power supplies from the outside, thereby further reducing the circuit complexity of ultrasonic fingerprint detection.

In some possible implementation manners, a voltage value of an input power supply of the signal generation circuit and a voltage value of an input power supply of the ultrasonic fingerprint sensor chip are between 3V and 4.5V.

In the current terminal device such as a mobile phone, a common voltage value of a power supply is between 3V and 4.5V. Through the technical solution of the implementation manners, the input power supply of the signal generation circuit and the input power supply of the ultrasonic fingerprint sensor chip in the ultrasonic fingerprint detection device both can be the power supply of the terminal device without requiring an additional power supply with a higher voltage, so as to be able to save the overall power consumption of the ultrasonic fingerprint detection device.

In a second aspect, there is provided an electronic device, including: a cover plate, and the ultrasonic fingerprint detection device in the first aspect or any possible implementation manner of the first aspect, where the cover plate is configured to receive pressing of a user finger, and the ultrasonic fingerprint detection device is disposed under the cover plate to detect a fingerprint of the user finger pressed against the cover plate.

In some possible implementation manners, the electronic device further includes: a display screen, where the cover plate is disposed above the display screen, and the ultrasonic fingerprint detection device is disposed under the display screen.

DESCRIPTION OF EMBODIMENTS

The technical solution in the present application will be described below with reference to the accompanying drawings.

The technical solution of the present application can be applied to an ultrasonic fingerprint detection device. As a common application scenario, an ultrasonic fingerprint detection device provided by an embodiment of the present application may be applied to smart phones, tablet computers, smart wearable devices, smart door locks or other types of electronic devices. More specifically, in the above electronic devices, the ultrasonic fingerprint detection device may be disposed on any surface of the electronic device interacting with a user, including but not limited to a front surface of the electronic device.

Figure 1:
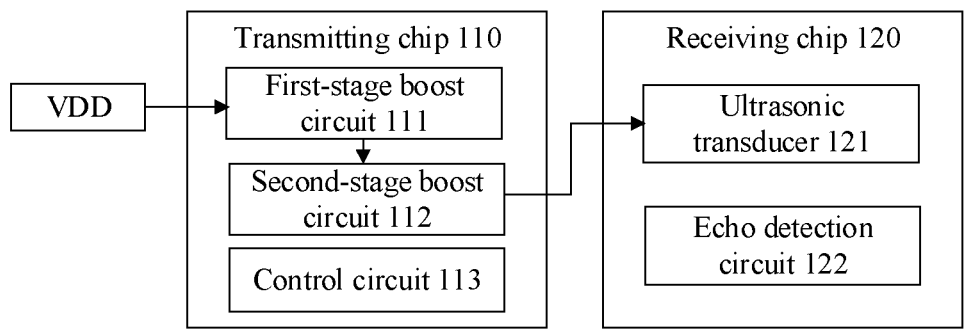
FIG. 1 is a schematic structural block diagram of an ultrasonic fingerprint detection device provided by an embodiment of the present application.

FIG. 1 shows a schematic structural block diagram of an ultrasonic fingerprint detection device 100 provided by an embodiment of the present application.

As shown in FIG. 1, the ultrasonic fingerprint detection device 100 includes: a transmitting (Tx) chip 110 and a receiving (Rx) chip 120.

The Tx chip 110 may be connected to a power supply VDD. In order to ensure the detection performance of the ultrasonic fingerprint detection device 100, the Tx chip 110 includes two stages of boost circuits 111 and 112 to boost and amplify a voltage of the input power supply VDD, so that the Tx chip 110 can generate a drive signal with a high voltage for the Rx chip.

As an example, the first-stage boost circuit 111 may be a Boost (boost) circuit, and the second-stage boost circuit 112 may be a resonant boost circuit. As an example, when a voltage of the power supply VDD is 3V, the first-stage boost circuit 111 may boost the voltage from 3V to 30V, and the second-stage boost circuit 112 may further boost the voltage from 30V to 140V for the second time.

The Rx chip 120 may include an ultrasonic transducer 121 and an echo detection circuit 122. The ultrasonic transducer 121 may receive the drive signal with a high voltage generated by the Tx chip 110 to generate ultrasonic waves. When the ultrasonic waves are emitted to a user finger, part of an echo signal reflected by the finger back to the Rx chip 120 is received by the ultrasonic transducer 121 again to be converted into an electrical signal, and the echo detection circuit 122 is configured to receive and detect the electrical signal. The electrical signal carries relevant information about ridges, valleys or other details of a fingerprint of the finger. Therefore, the Rx chip 120 can detect the fingerprint of the user finger by detecting the electrical signal.

In the implementation manners, the Tx chip 110 is required to generate a drive signal with a high voltage up to 100V, and the voltage of this level cannot be compatible with a manufacturing process of the Rx chip 120. Therefore, the Tx chip 110 and the Rx chip 120 are generally designed as two discrete chips. If the Tx chip 110 and the Rx chip 120 are to be integrated into one chip, the Rx chip 120 also needs to adopt a high-voltage manufacturing process, which will lead to an increase in cost.

In addition, the boost circuit in the Tx chip 110 has a relatively complicated circuit structure, and an independent control circuit 113 is required to be provided in the Tx chip 110 to perform related control on the boost circuit.

Therefore, in the implementation manners, a "dual-chip" architecture of an ultrasonic fingerprint detection device 100 means large size, complicated circuit and high cost. In view of this, the present application provides an ultrasonic fingerprint detection device with a "single-chip" architecture, which can reduce the size, circuit complexity and cost of the above ultrasonic fingerprint detection device.

Figure 2:
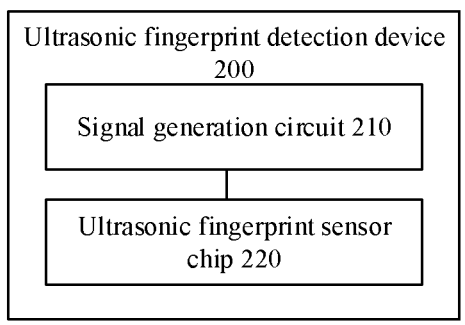
FIG. 2 is a schematic structural block diagram of another ultrasonic fingerprint detection device provided by an embodiment of the present application.

FIG. 2 shows a schematic structural block diagram of an ultrasonic fingerprint detection device 200 provided by an embodiment of the present application.

As shown in FIG. 2, the ultrasonic fingerprint detection device 200 includes: a signal generation circuit 210 and an ultrasonic fingerprint sensor chip 220. The signal generation circuit 210 is composed of discrete devices and the signal generation circuit includes: a boost circuit configured to boost an input power supply to form a drive signal, and a voltage value of the drive signal is greater than a voltage value of the input power supply. The ultrasonic fingerprint sensor chip 220 is configured to receive the drive signal, and generate an ultrasonic signal for fingerprint detection under the action of the drive signal.

Specifically, in the embodiment of the present application, the signal generation circuit 210 is not a chip, but a circuit structure composed of discrete devices. Therefore, compared with the "dual-chip" architecture, the ultrasonic fingerprint detection device 200 provided in the embodiment of the present application only includes one ultrasonic fingerprint sensor chip 220, and the overall manufacturing cost will be significantly reduced.

In the signal generation circuit 210, a first-stage boost circuit is only included, and the first-stage boost circuit is configured to boost the input power supply to form the drive signal with a high voltage, thereby boosting a driving effect of the drive signal for the ultrasonic fingerprint sensor chip 220 to ensure the detection performance of the ultrasonic fingerprint sensor chip 220. In addition, in comparison with the two-stage boost circuit included in the Tx chip 110 in the above embodiment shown in FIG. 1, the embodiment of the present application simplifies a circuit structure, thereby reducing the overall circuit complexity and the overall size.

In some implementation manners, the boost circuit in the signal generation circuit 210 may include a resonant circuit, and the resonant circuit may form a resonance to generate a drive signal with a high voltage. The circuit structure of the resonant circuit is relatively simple and easy to implement, which can further reduce the overall circuit complexity and the overall cost of the ultrasonic fingerprint detection device 200.

Specifically, in the ultrasonic fingerprint sensor chip 220, the ultrasonic transducer 121 and the echo detection circuit 122 in the Rx chip 120 as shown in FIG. 1 may be included. The ultrasonic transducer 121 may generate an ultrasonic signal under the action of the drive signal provided by the signal generation circuit 210, and may receive an echo signal obtained by reflecting the ultrasonic signal via a user finger to generate an electrical signal. The echo detection circuit 122 may detect the electrical signal for fingerprint detection.

Optionally, the ultrasonic transducer 121 may include a piezoelectric layer and upper and lower electrode layers. For example, a piezoelectric material of the piezoelectric layer includes but is not limited to polyvinylidene fluoride (PVDF), polyvinylidene fluoride-trifluoroethene (PVDF-TrFE) copolymer, etc. When the piezoelectric layer receives the drive signal with a high voltage from the upper and lower electrode layers, it converts electrical energy into mechanical energy, thereby generating the ultrasonic signal. Correspondingly, the piezoelectric layer can also convert the returned ultrasonic echo signal from mechanical energy into electrical energy, thereby generating an electrical signal corresponding to the echo signal.

Through the technical solution of the embodiment of the present application, there is provided an ultrasonic fingerprint detection device 200 with a "single-chip" architecture that includes an ultrasonic fingerprint sensor chip 220 and a signal generation circuit 210 composed of discrete devices. The signal generation circuit 210 includes a one-stage boost circuit, and the one-stage boost circuit further has a relatively simple circuit structure, a relatively small circuit area and a relatively low manufacturing cost in addition to boosting an input power supply to generate a drive signal with a high voltage to ensure a detection effect of the ultrasonic fingerprint sensor chip 220. Therefore, in comparison with an ultrasonic fingerprint detection device with a "dual-chip" architecture, the technical solution of the embodiment of the present application can reduce the size, circuit complexity and manufacturing cost of the ultrasonic fingerprint detection device.

In some implementation manners, a voltage value of an input power supply of the signal generation circuit 210 is the same as a voltage value of an input power supply of the ultrasonic fingerprint sensor chip 220.

Optionally, the signal generation circuit 210 and the ultrasonic fingerprint sensor chip 220 may be connected to a same power supply, so that the same power supply provides electric energy for both of the signal generation circuit 210 and the ultrasonic fingerprint sensor chip 220.

Through the technical solution of the implementation manners, the ultrasonic fingerprint detection device 200 provided in the embodiment of the present application only needs one power supply, and does not need to be connected to multiple types of power supplies from the outside, thereby further reducing the circuit complexity of ultrasonic fingerprint detection.

In some implementation manners, a voltage value of an input power supply of the signal generation circuit 210 and a voltage value of an input power supply of the ultrasonic fingerprint sensor chip 220 are between 3V and 4.5V.

In the current terminal device such as a mobile phone, a common voltage value of a power supply is between 3V and 4.5V. Through the technical solution of the implementation manners, the input power supply of the signal generation circuit 210 and the input power supply of the ultrasonic fingerprint sensor chip 220 in the ultrasonic fingerprint detection device 200 both can be the power supply of the terminal device without requiring an additional power supply with a higher voltage, so as to be able to save the overall power consumption of the ultrasonic fingerprint detection device 200.

Figure 3:
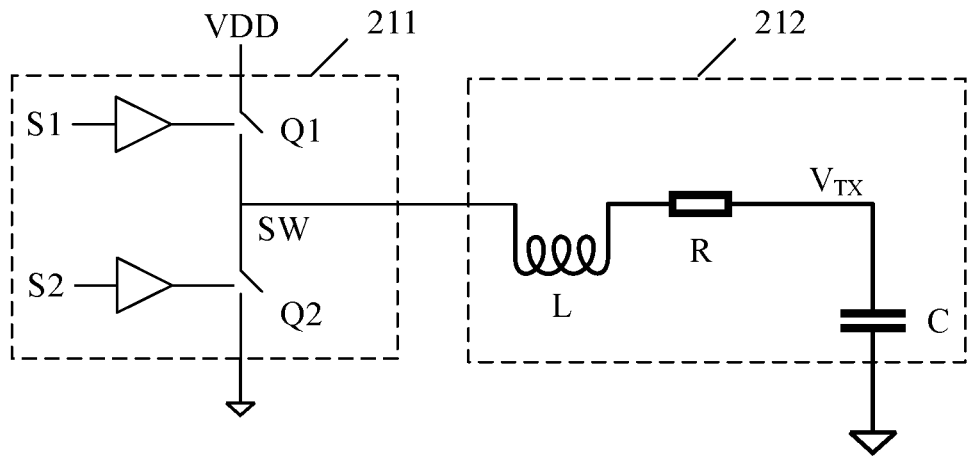
FIG. 3 is a schematic circuit diagram of a signal generation circuit provided by an embodiment of the present application.

FIG. 3 shows a schematic circuit diagram of a signal generation circuit 210 provided by an embodiment of the present application.

As shown in FIG. 3, in the signal generation circuit 210, the above boost circuit includes a control circuit 211 and a resonant circuit 212. The control circuit 211 is connected to an input power supply VDD, and the control circuit 211 is configured to receive a control signal provided by the ultrasonic fingerprint sensor chip 220, and generate an excitation signal under the action of the control signal and the input power supply. The resonant circuit 212 is connected to the control circuit 211, and the resonant circuit 212 is configured to receive the excitation signal provided by the control circuit 211, and form a drive signal under the action of the excitation signal.

Optionally, as shown in FIG. 3, the resonant circuit 212 may include an inductor L and a capacitor C connected in series to form an LC series resonant circuit. The inductor L may have an equivalent resistor R, and the resistor R may be regarded as being connected in series with the LC to form the LC series resonant circuit.

Optionally, the above capacitor C may be an equivalent capacitor of the ultrasonic transducer in the ultrasonic fingerprint sensor chip 220, or the capacitor C may also be an equivalent capacitor of the ultrasonic transducer and the overall equivalent capacitor of other adjustable capacitors. Optionally, the capacitor C may also be connected in series with an equivalent resistor of the ultrasonic transducer, that is, the resonant circuit 212 may include the equivalent resistor of the ultrasonic transducer in addition to an equivalent resistor R of the above inductor L.

The control circuit 211 may receive a control signal sent by the ultrasonic fingerprint sensor chip 220, and generate an excitation signal for exciting the LC series resonant circuit under the action of the control signal. Under the action of the excitation signal, the LC series resonant circuit can resonate a drive signal with a high voltage, and a voltage value of the drive signal is greater than a voltage value of the input power supply of the signal generation circuit 210.

Through the technical solution of the embodiment of the present application, the signal generation circuit 210 may include a control circuit 211 and a resonant circuit 212, where the resonant circuit 212 has a relatively simple circuit structure and is easy to implement and control, so that a good boosting effect can be achieved. In addition, the control circuit 211 may obtain the control signal from the ultrasonic fingerprint sensor chip 220 without the need to obtain the control signal from other external control devices. Therefore, in addition to controlling related operations of internal components, the ultrasonic fingerprint sensor chip 220 can also control related operations of the control signal generation circuit 210, so as to ensure the normal operation of the ultrasonic fingerprint detection device 200 as a whole.

Optionally, as an example, as shown in FIG. 3, the control circuit 211 includes two switching transistors Q1 and Q2 connected in series between the input power supply VDD and ground. The two switching transistors Q1 and Q2 are turned on and off under the action of the control signal, so as to output the excitation signal SW at a node between the two switching transistors Q1 and Q2.

In some implementation manners, the ultrasonic fingerprint sensor chip 220 may provide one control signal to the control circuit 211, and the control signal generates two control signals S1 and S2 after processed by a device inside the control circuit 211. The first switching transistor Q1 is turned on and off under the action of the first control signal S1, and the second switching transistor Q2 is turned on and off under the action of the second control signal S2.

Alternatively, in some other implementation manners, the ultrasonic fingerprint sensor chip 220 may also provide two control signals S1 and S2 to the control circuit 211 directly, so as to control the turn-on and turn-off of the two switching transistors Q1 and Q2 directly.

Continuing to refer to FIG. 3, as an example, the resonant circuit 212 includes a capacitor C and an inductor L connected in series between the control circuit 211 and ground, and the capacitor C and the inductor L can generate a drive signal $V_{TX}$ under the action of the above pulse excitation signal. Optionally, the resonant circuit 212 may further include a resistor R connected to the capacitor C and the inductor L in addition to the capacitor C and the inductor L connected in series.

Figure 4:
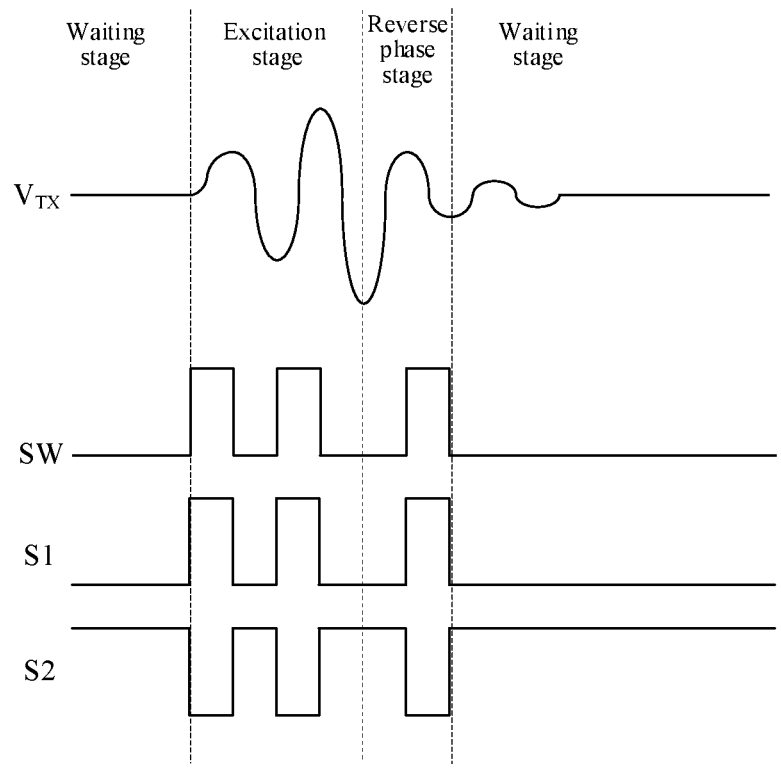
FIG. 4 is a schematic waveform diagram of control signals, an excitation signal, and a drive signal provided by an embodiment of the present application.

For ease of understanding, FIG. 4 shows a schematic waveform diagram of the control signals S1 and S2, the excitation signal SW and the drive signal $V_{TX}$ provided by an embodiment of the present application.

As shown in FIG. 4, a working state of the signal generation circuit 210 includes: a waiting stage, an excitation stage and a reverse phase stage.

In the waiting stage of the signal generation circuit 210, the resonant circuit 212 does not generate resonance. Optionally, in the waiting stage, the first control signal S1 is at a low level to control the first switching transistor Q1 to be turned off, and the second control signal S2 is at a high level to control the second switching transistor Q2 to be turned on. In this case, both the excitation signal SW output by the control circuit 211 and the drive signal $V_{TX}$ output by the resonant circuit 212 are at a low level.

In the excitation stage of the signal generation circuit 210, the two switching transistors Q1 and Q2 in the control circuit 211 may be turned on alternately under the action of the control signal to generate the pulse excitation signal SW. Further, the inductor L and the capacitor C in the resonant circuit 212 may resonate under the action of the pulse excitation signal SW to generate a sine wave drive signal $V_{TX}$.

Optionally, in order to realize the alternate turn-on of the two switching transistors Q1 and Q2, the first control signal S1 and the second control signal S2 may be pulse signals with reverse phases to each other. A frequency of the pulse signal may be equal to a resonant frequency of the LC series resonant circuit 212, so that both ends of the capacitor C resonate to generate the sine wave drive signal $V_{TX}$ with a high voltage. That is, the frequency f of the pulse signal satisfies the following formula:

$$f = \frac{1}{2\pi\sqrt{LC}},$$

where L and C in this formula represent magnitudes of the inductor L and the capacitor C, respectively.

Optionally, in the excitation stage of the signal generation circuit 210, a waveform of the pulse excitation signal SW output by the control circuit 211 may be the same as a waveform of the control signal S1 of the first switching transistor Q1. When the first control signal S1 is at a high level and the second control signal S2 is at a low level, the first switching transistor Q1 is turned on, the second switching transistor Q2 is turned off, and the output pulse excitation signal SW is at a high level. When the first control signal S1 is at a low level and the second control signal S2 is at a high level, the first switching transistor Q1 is turned off, the second switching transistor Q2 is turned on, and the output pulse excitation signal SW is at a low level.

Under the action of the pulse excitation signal SW, the sine wave drive signal $V_{TX}$ may be a sine wave signal of which an amplitude gradually increases.

Continuing to refer to FIG. 4, when it is required to stop outputting the sine wave drive signal $V_{TX}$, the two switching transistors Q1 and Q2 can be both turned off, so that the output pulse excitation signal SW remains at a low level, and the resonance returns to zero through the resistor R. But in fact, since oscillation energy of the resonant circuit cannot disappear immediately, the sine wave drive signal $V_{TX}$ slowly drops to zero. Therefore, before turning off the switching transistors Q1 and Q2, a reverse driving method can be used, that is, phase reversal is performed on the pulse excitation signal SW, thereby speeding up resonance energy of the resonant circuit to return to zero.

Specifically, the two switching transistors Q1 and Q2 can be turned on alternately in reverse phase under the action of the control signal to generate a reverse phase pulse excitation signal. The reverse phase pulse excitation signal and the pulse excitation signal SW generated in the above excitation stage are the reverse of each other in phase. The reverse phase pulse excitation signal is used to damp resonance of the resonant circuit 212 to reduce resonance energy of the generated sine wave drive signal $V_{TX}$.

As shown in FIG. 4, in the reverse phase stage of the signal generation circuit 210, when the reverse phase drive signal is increased, residual resonance of the sine wave drive signal Tx is obviously reduced.

It should be noted that, in some implementation manners, time for reverse phase driving should not be too long, for example, FIG. 4 shows that the time for reverse phase driving is one signal period. In the reverse phase driving stage, the two switching transistors Q1 and Q2 are turned on and off alternately, but the switching phase and the excitation stage are completely reverse in phase.

It can be understood that the above FIG. 3 and FIG. 4 are only for illustration instead of limitation, and show the circuit structures of the resonant circuit 212 and the control circuit 211 and the corresponding schematic signal waveform diagram in one implementation manner. In some alternative implementation manners, the resonant circuit 212 and the control circuit 211 may also adopt other circuit structures, so that the two cooperate to realize a resonant boosting effect on the input power supply. In the embodiment of the present application, the specific circuit structures of the resonant circuit 212 and the control circuit 211 are not limited.

In addition, in FIG. 4 and a schematic waveform diagram shown below, the drive signal SW in the excitation stage only shows a pulse signal within two periods, and the pulse signal within two periods is only for illustration, and the drive signal SW in the excitation stage may also be a pulse signal with any other number of periods, and the present application does not limit the number of periods of the pulse signal of the drive signal SW in the excitation stage.

Moreover, in FIG. 4 and the schematic waveform diagram shown below, when the excitation stage starts, the control signals S1 and S2 first control the first switching transistor Q1 to be turned on and then control the second switching transistor Q2 to be turned on. Optionally, the control signal S1 and S2 may also first control the second switching transistor Q2 to be turned on and then control the first switching transistor Q1 to be turned on, and the present application does not limit the sequence of turning on the first switching transistor Q1 and the second switching transistor Q2 either.

Figure 5:
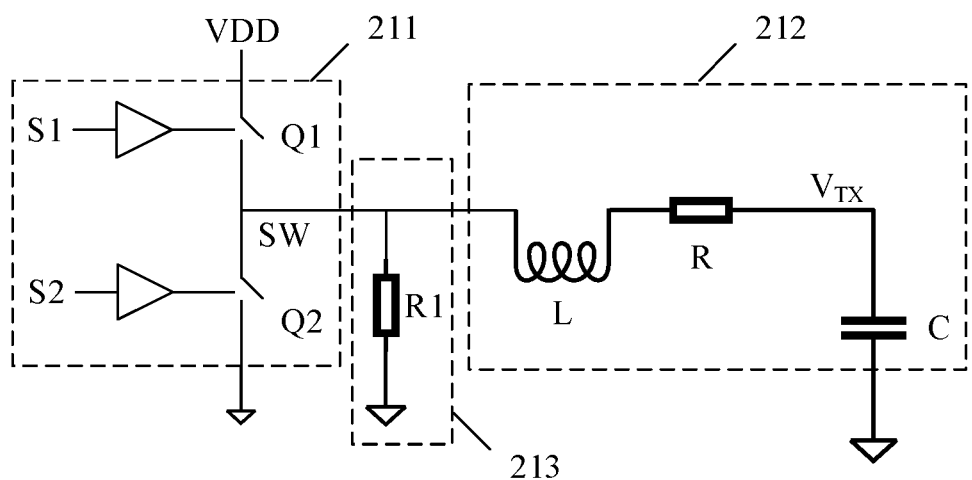
FIG. 5 is a schematic circuit diagram of another signal generation circuit provided by an embodiment of the present application.

On the basis of the above embodiment shown in FIG. 3, FIG. 5 shows a schematic circuit diagram of another signal generation circuit 210 provided by an embodiment of the present application.

As shown in FIG. 5, in the signal generation circuit 210, in addition to the control circuit 211 and the resonant circuit 212 mentioned above, the signal generation circuit 210 further includes a brake circuit 213 including a damping resistor R1 connected between the resonant circuit 212 and the control circuit 211.

Through the technical solution of this embodiment, the brake circuit 213 including the damping resistor R1 is added to the signal generation circuit 210 to absorb redundant signal energy generated by the resonant circuit 212 when it is desired that the resonant circuit 212 stops outputting the sine wave drive signal Tx, so that residual resonance of the sine wave drive signal output by the resonant circuit 212 is improved, and quality of the sine wave drive signal is improved.

As an example, in the embodiment shown in FIG. 5, one end of the damping resistor R1 is connected between the resonant circuit 212 and the control circuit 211, and the other end of the damping resistor R1 is grounded.

When the signal generation circuit 210 needs to stop outputting the drive signal Tx, the two switching transistors Q1 and Q2 in the control circuit 211 are both turned off. In this case, the control circuit 211 is disconnected, and the damping resistor R1 can be connected in series with the resonant circuit 212. The damping resistor R1 is configured to damp resonance of the resonant circuit 212 to reduce resonance energy of the generated sine wave drive signal Tx, so that the resonance of the resonant circuit 212 returns to zero quickly.

In this example, a resistance value of the damping resistor R1 is related to a characteristic impedance Z of the resonant circuit 212. In order to achieve a better damping "brake" effect, in some implementation manners, a resistance value of the damping resistor R1 may be between 0.8*Z and 2*Z, where $Z=\sqrt{L/C}$, and L and C are values of the inductor L and the capacitor C in the resonant circuit 212, respectively. Optionally, the resistance value of the damping resistor R1 includes but is not limited to 1.4*Z.

Specifically, in the embodiment shown in FIG. 5, the inductor L in the resonant circuit 212 further has an equivalent resistor R, and the resistor R can act as a damping "brake" function for the LC resonance together with the above damping resistor R1. Therefore, the sum of the resistance values of the damping resistor R1 and the resistor R may be between 0.8*Z and 2*Z. Optionally, the sum of the resistance values of the damping resistor R1 and the resistor R includes but is not limited to 1.4*Z.

In an implementation manner of the example, the brake circuit 213 is relatively simple in a circuit structure and relatively low in cost. Through the brake circuit 213, on the basis of ensuring that the signal generation circuit 210 can output a drive signal of high quality, the overall cost of the signal generation circuit 210 and the ultrasonic fingerprint detection device 200 where the signal generation circuit 210 is located can be further reduced.

Optionally, in the case of adding the brake circuit 213, the excitation signal SW of the resonant circuit 212 can be further reversed in phase, so as to further speed up the resonance of the resonant circuit 212 to return to zero.

Figure 6:
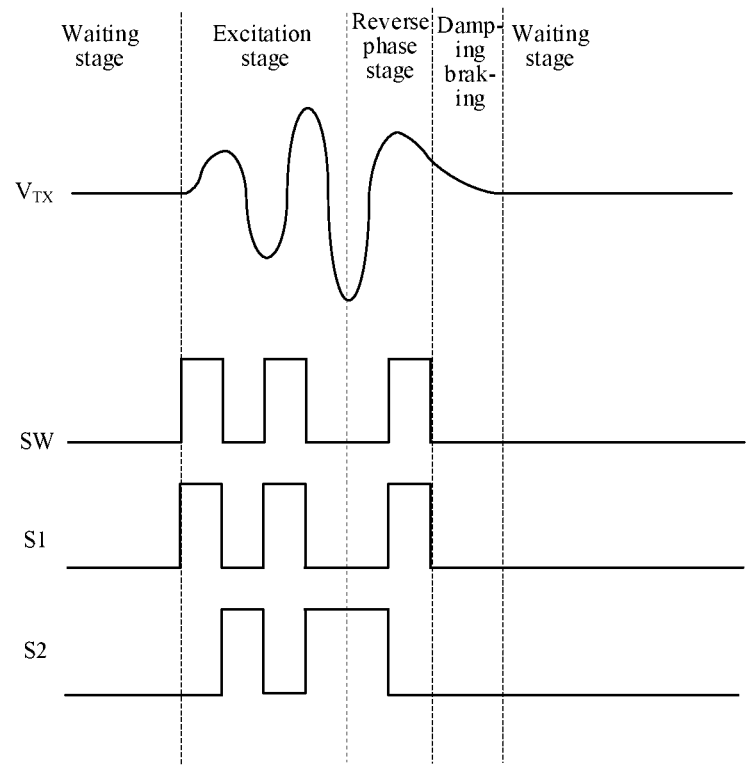
FIG. 6 is another schematic waveform diagram of control signals, an excitation signal, and a drive signal provided by an embodiment of the present application.

For ease of understanding, FIG. 6 shows another schematic waveform diagram of the control signals S1, S2, the excitation signal SW and the drive signal $V_{TX}$ according to an embodiment of the present application.

As shown in FIG. 6, a working state of the signal generation circuit 210 includes: a waiting stage, an excitation stage, a reverse phase stage and a damping braking stage.

In the waiting stage of the signal generation circuit 210, both the first control signal S1 and the second control signal S2 are at a low level to control both the first switching transistor Q1 and the second switching transistor Q2 to be turned off. In this case, the resonant circuit 212 is connected to the ground through the brake circuit 213. Both the excitation signal SW output by the control circuit 211 and the drive signal $V_{TX}$ output by the resonant circuit 212 are at a low level.

In the excitation stage of the signal generation circuit 210, the two switching transistors Q1 and Q2 in the control circuit 211 can be turned on alternately under the action of the control signal to generate the pulse excitation signal SW. Further, the inductor L and the capacitor C in the resonant circuit 212 can resonate under the action of the pulse excitation signal SW to generate the sine wave drive signal $V_{TX}$.

In the reverse phase stage of the signal generation circuit 210, the two control signals S1 and S2 are the reverse of each other in phase, and the two switching transistors Q1 and Q2 are still turned on and off alternately, but the switching phase and the excitation stage are completely reverse in phase. Therefore, the pulse excitation signal SW generated by the two switching transistors Q1 and Q2 also generates the corresponding reverse phase, thereby reducing resonance energy of the resonant circuit 212. In the reverse phase stage, the damping resistor R1 therein can further speed up the reduction of the resonance energy of the resonant circuit 212 by setting the brake circuit 213.

The related technical solution about the signals in the excitation stage and the reverse phase stage may be the same as that in the excitation stage in the above embodiment shown in FIG. 4. For specific implementation, reference may be made to the above description, and details will not be repeated here.

In the damping and braking stage of the signal generation circuit 210, the two control signals S1 and S2 are both at a low level, and the two switching transistors Q1 and Q2 are both turned off. In this case, the damping resistor R1 in the brake circuit 213 can continue to act a damping "brake" function on the resonance of the resonant circuit 212 to reduce the resonant energy of the resonant circuit 212 quickly, so that the resonance can quickly return to zero.

Optionally, in addition to the damping resistor R1 shown in FIG. 5, the brake circuit 213 may further include other devices, such as a switching transistor. By controlling the switching transistor, the damping resistor R1 can act a "damping" brake function on the resonance of the resonant circuit 212 during the damping and braking stage, and will not affect the resonance effect of the resonant circuit 212 in the excitation stage.

However, in the embodiment shown in FIG. 5, the brake circuit 213 may be provided with only one damping resistor R1 without requiring an additional switching transistor and a control signal for controlling the switching transistor. Therefore, compared with other types of brake circuits 213, the brake circuit 213 of the embodiment shown in FIG. 5 has a relatively low cost.

In addition, in the embodiment shown in FIG. 5, a voltage value of the input power supply VDD of the signal generation circuit 210 is generally relatively low. For example, as mentioned above, the voltage value of the input power supply VDD may be between 3V and 4.5V. Therefore, even if the damping resistor R1 in the brake circuit 213 is connected between an output terminal of the control circuit 211 and the ground, when the control signal SW output from the output terminal of the control circuit 211 is at a high level, a current will be generated on the damping resistor R1, but since the voltage value of the input power supply VDD is small, the current generated on the damping resistor R1 can be correspondingly small without causing large power consumption.

Figure 7:
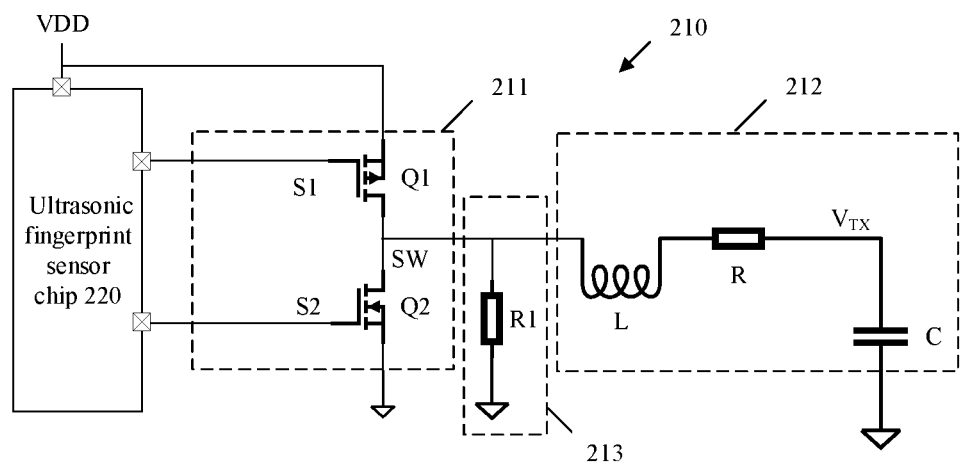
FIG. 7 is a schematic structural diagram of another ultrasonic fingerprint detection device provided by an embodiment of the present application.

FIG. 7 shows a schematic structural diagram of another ultrasonic fingerprint detection device 200 provided by an embodiment of the present application.

As shown in FIG. 7, in the control circuit 211 of the signal generation circuit 210, a switching transistor (that is, the first switching transistor Q1) of the two switching transistors connected to the input power supply VDD is a P channel metal oxide semiconductor (positive channel Metal Oxide Semiconductor, PMOS) field effect transistor, or may also referred to as a PMOS transistor for short. A switching transistor (that is, the second switching transistor Q2) of the two switching transistors connected to the ground is an N channel metal oxide semiconductor (negative channel Metal Oxide Semiconductor, NMOS) field effect transistor, or may also be referred to as an NMOS transistor for short.

Optionally, as shown in FIG. 7, the ultrasonic fingerprint sensor chip 220 is configured to provide control signals S1 and S2 to the control circuit 211 in the signal generation circuit 210 to control the PMOS transistor and the NMOS transistor respectively.

Specifically, the first control signal S1 is used to control the turn-on and turn-off of the PMOS transistor. When the first control signal S1 is at a low level, the PMOS transistor is turned on. Conversely, when the first control signal S1 is at a high level, the PMOS transistor is turned off. The second control signal S2 is used to control the turn-on and turn-off of the NMOS transistor. When the second control signal S2 is at a high level, the NMOS transistor is turned on. Conversely, when the second control signal S2 is at a low level, the NMOS transistor is turned off.

Optionally, high levels of the first control signal S1 and the second control signal S2 may be consistent with the voltage value of the input power supply VDD of the ultrasonic fingerprint sensor chip 220, for example, the high levels of the first control signal S1 and the second control signal S2 may be both 3V. Low levels of the first control signal S1 and the second control signal S2 may be ground, that is, 0V.

Optionally, in the embodiment shown in FIG. 7, an input power supply of the ultrasonic fingerprint sensor chip 220 and an input power supply of the signal generation circuit 210 may be the same power supply VDD.

In this case, if the first switching transistor Q1 in the signal generation circuit 210 is set as a PMOS transistor, and the second switching transistor Q2 is set as an NMOS transistor, the control signal provided by the ultrasonic fingerprint sensor chip 220 can realize the effective control of the first switching transistor Q1 and the second switching transistor Q2 effectively without other additional circuits and signals to drive and control the first switching transistor Q1 and the second switching transistor Q2. The signal generation circuit 210 is low in circuit structure complexity and manufacturing cost.

In some alternative implementation manners, for example, when both the first switching transistor Q1 and the second switching transistor Q2 in the signal generation circuit 210 are set as PMOS transistors or both are set as NMOS transistors, at least one of the two switching transistors needs to add an additional driving circuit or be connected to other input power supplies to realize the turn-on and turn-off under the control signal provided by the ultrasonic fingerprint sensor chip 220. Therefore, the circuit complexity and manufacturing cost of the alternative implementation manners are slightly higher.

In the embodiment of the present application, except the types of the two switching transistors Q1 and Q2, other circuit structures of the signal generation circuit 210 may be the same as those in the above embodiment shown in FIG. 5. For specific circuit solutions, reference may be made to the above relevant descriptions, and details will not be repeated here.

Figure 8:
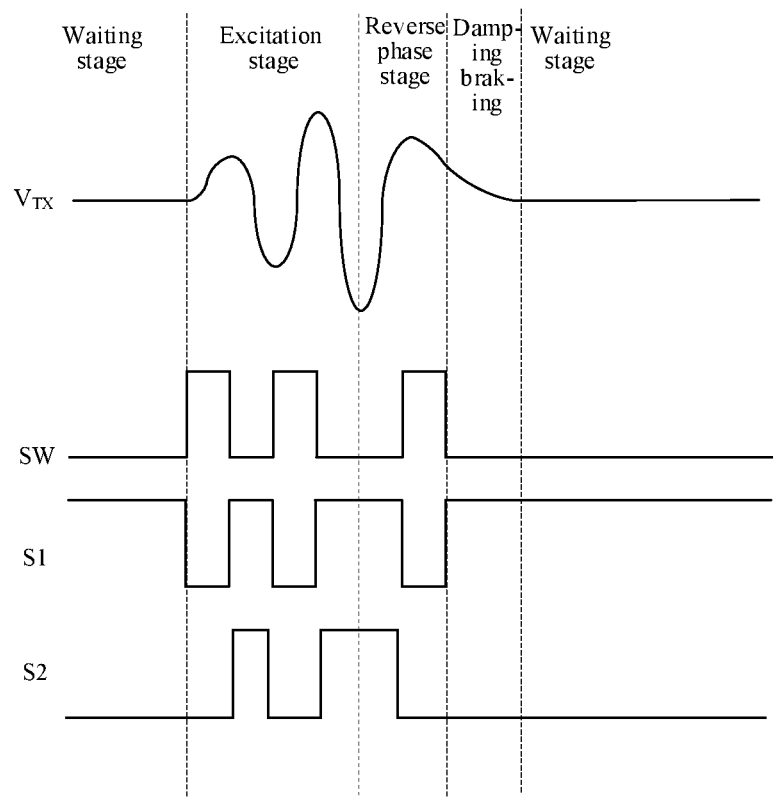
FIG. 8 is another schematic waveform diagram of a control signal, an excitation signal, and a drive signal provided by an embodiment of the present application.

For ease of understanding, FIG. 8 shows a schematic waveform diagram of the control signals S1 and S2 provided by the ultrasonic fingerprint sensor chip 220, the excitation signal SW output by the control circuit 211, and the drive signal $V_{TX}$ output by the resonant circuit 212.

As shown in FIG. 8, in the embodiment of the present application, except that the first control signal S1 is slightly different from the first control signal S1 in the above embodiment shown in FIG. 6, waveform characteristics of other signals may be the same as those in the above embodiment shown in FIG. 6.

Specifically, in the embodiment shown in FIG. 8, since the first control signal S1 is used to control the PMOS transistor (the first switching transistor Q1), the first control signal S1 controls the first switching transistor Q1 to be turned on when it is at a low level, and controls the first switching transistor Q1 to be turned off when it is at a high level. In the embodiment shown in FIG. 6, the first control signal S1 controls the first switching transistor Q1 to be turned on when it is at a high level, and controls the first switching transistor Q1 to be turned off when it is at a low level. Therefore, the first control signal S1 in the embodiment shown in FIG. 8 and the first control signal S1 in the embodiment shown in FIG. 6 may be the reverse of each other in phase, but control processes of the first switching transistor Q1 in the two embodiments are the same.

It should be noted that in the excitation stage of the signal generation circuit 210, the two switching transistors Q1 and Q2 cannot be turned on at the same time, otherwise, it will lead to a short circuit between the input power supply VDD and ground to form a large current, which affects the switching transistors Q1 and Q2. Therefore, under the action of the control signals S1 and S2, after a state of one of the two switching transistors Q1 and Q2 is changed from turn-on to turn-off followed by a preset time, a state of the other of the two switching transistors is changed from turn-off to turn-on. When the two switching transistors Q1 and Q2 are turned on and off alternately, there will be a time gap between the control signals S1 and S2, and the time gap can be called "dead time". During the dead time, the two switching transistors Q1 and Q2 are both in a turn-off state.

Figure 9:
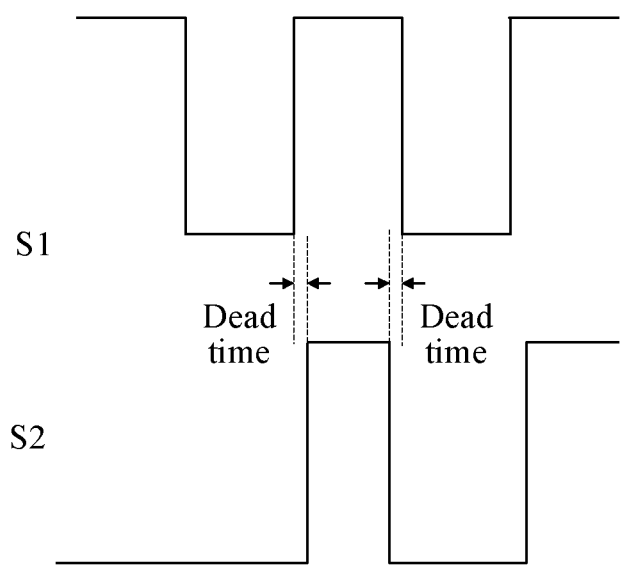
FIG. 9 is a schematic enlarged waveform diagram of the control signal in FIG. 8 during an excitation stage.

FIG. 9 shows a schematic enlarged waveform diagram of the control signals S1 and S2 in the excitation stage in FIG. 8.

As shown in FIG. 9, in an embodiment of the present application, there is a dead time between a rising edge of the first control signal S1 and a rising edge of the second control signal S2, and the dead time is a preset time. Specifically, after the rising edge of the first control signal S1 followed by the preset time, the second control signal S2 generates the rising edge, that is, after the first switching transistor Q1 (PMOS transistor) controlled by the first control signal S1 is changed from turn-on to turn-off followed by the preset time, the second switching transistor Q2 (NMOS transistor) controlled by the second control signal S2 is changed from turn-off to turn-on.

Similarly, there is also a dead time between a falling edge of the first control signal S1 and a falling edge of the second control signal S2, and the dead time is a preset time. Specifically, after the falling edge of the second control signal S2 followed by the preset time, the first control signal S1 generates the falling edge, that is, after the second switching transistor Q2 (NMOS transistor) controlled by the second control signal S2 is changed from turn-on to turn-off followed by the preset time, the first switching transistor Q1 (PMOS transistor) controlled by the first control signal S1 is changed from turn-off to turn-on.

Through the technical solution of this embodiment, it can be ensured that the two switching transistors Q1 and Q2 are not turned on at the same time so as not to cause a large current to be introduced into the two switching transistors Q1 and Q2, which thus ensures use reliability of the control circuit 211, and is conducive to improving service life of the control circuit 211.

The above embodiments introduce the signal generation circuit 210 in the ultrasonic fingerprint detection device 200 provided by the present application with reference to FIGS. 3 to 9. Below, an ultrasonic fingerprint sensor chip 220 in the ultrasonic fingerprint detection device 200 provided by the present application is described with reference to FIGS. 10 to 12.

Figure 10:
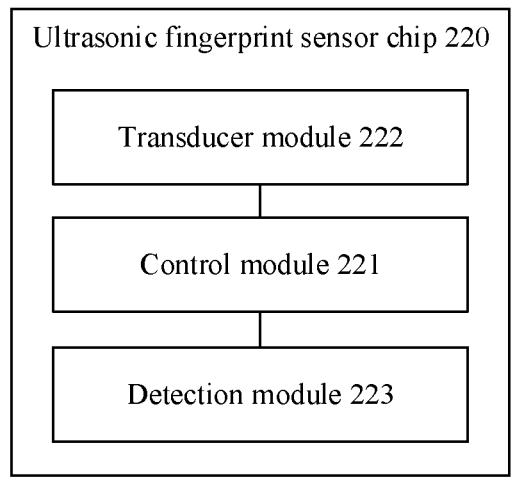
FIG. 10 is a schematic structural block diagram of an ultrasonic fingerprint sensor chip provided by an embodiment of the present application.

FIG. 10 shows a schematic structural block diagram of an ultrasonic fingerprint sensor chip 220 provided by an embodiment of the present application.

As shown in FIG. 10, the ultrasonic fingerprint sensor chip 220 includes: a control module 221, a transducer module 222 and a detection module 223. The control module 221 is configured to provide a control signal to the signal generation circuit 210 to control the signal generation circuit 210 to generate a drive signal. The transducer module 222 is configured to receive the drive signal to generate an ultrasonic signal, and the ultrasonic signal is reflected by a user finger to generate an echo signal, and the transducer module 222 is configured to convert the echo signal into an electrical signal. The detection module 223 is configured to detect the electrical signal to detect a fingerprint of the user finger.

Specifically, in the embodiment of the present application, the transducer module 222 may include the ultrasonic transducer 121 in the above embodiment shown in FIG. 1. The detection module 223 may include the echo detection circuit 122 in the above embodiments.

The control module 221 may be a controller in the ultrasonic fingerprint sensor chip 220, which can be connected to the above transducer module 222 and detection module 223, and control the operation of the transducer module 222 and the detection module 223. In addition, the control module 221 may be further configured to provide a control signal to the signal generation circuit 210 to control the operation of the signal generation circuit 210.

Through the control module 221 in the ultrasonic fingerprint sensor chip 220, the overall fingerprint detection process of the ultrasonic fingerprint detection device 200 can be uniformly controlled, so as to ensure that that the fingerprint detection process is carried out in an orderly manner to ensure a fingerprint detection effect, and a circuit structure of the ultrasonic fingerprint detection device 200 is further simplified, and circuit complexity of the ultrasonic fingerprint detection device 200 is reduced.

In combination with the relevant technical solutions for the signal generation circuit 210 in the above embodiment, it can be seen that in some implementation manners, a voltage value of an input power supply of the signal generation circuit 210 is relatively low, for example, the voltage value is 3V, and in this case, even if the signal generation circuit 210 boosts the 3V voltage of the input power supply, a voltage value of the output drive signal $V_{TX}$ is generally about 20V. In comparison with the technical solution of boosting the drive signal to more than 100V through two-stage boosting in the related art, the voltage value of the drive signal $V_{TX}$ output by the above signal generation circuit 210 is relatively low, which will affect a fingerprint detection effect of the ultrasonic fingerprint sensor chip 220 to a certain extent.

In view of this, in the ultrasonic fingerprint sensor chip 220 provided in the embodiment of the present application, the control module 221 may be configured to send a control signal to the signal generation circuit 210 multiple times to control the signal generation circuit 210 to generate a plurality of drive signals. The transducer module 222 is configured to receive the plurality of drive signals to generate a plurality of ultrasonic signals, and convert a plurality of echo signals corresponding to the plurality of ultrasonic signals into a plurality of electrical signals. The detection module 223 is configured to detect the plurality of echo signals to detect the fingerprint of the user finger.

Specifically, during a process in which the control module 221 sends the control signal to the signal generation circuit 210 once, the control module 221 may send a first control signal S1 and a second control signal S2 for a preset duration to the signal generation circuit 210, and the first control signal S1 and the second control signal S2 may both include pulse signals with multiple periods.

Optionally, during the process in which the control module 221 sends a control signal to the signal generation circuit 210 once, specific waveforms and related technical solutions of the first control signal S1 and the second control signal S2 may refer to the technical solution of any of the above embodiments in FIG. 4, FIG. 6 or FIG. 8. Optionally, the first control signal S1 and the second control signal S2 may control the signal generation circuit 210 to operate in a waiting stage, an excitation stage, a reverse phase stage, a damping braking stage and a waiting stage in sequence.

After the control module 221 sends the control signal to the signal generation circuit 210 once, the signal generation circuit 210 generates one drive signal $V_{TX}$ under the action of the control signal. The transducer module 222 receives the drive signal $V_{TX}$ and generates one ultrasonic signal under the action of the drive signal $V_{TX}$. The ultrasonic signal is reflected by the user finger to form one echo signal, and the transducer module 222 receives the echo signal and converts it into a corresponding electrical signal, so that the detection module 223 detects the electrical signal.

The above process can be understood as "one detection" of the fingerprint of the user finger by the ultrasonic fingerprint sensor chip 220. When the above process is repeated, "multiple detection" of the fingerprint of the user finger by the ultrasonic fingerprint sensor chip 220 can be realized, and a fingerprint result obtained by the "multiple detection" has higher accuracy, which can improve the fingerprint detection effect of the ultrasonic fingerprint sensor chip 220.

Optionally, in some implementation manners, the control module 221 may be configured to periodically send the control signal to the signal generation circuit 210 to control the signal generation circuit 210 to generate the drive signal. The control module 221 is configured to control the transducer module 222 to periodically receive the drive signal to generate the ultrasonic signal. And the control module 221 is configured to control the detection module 223 to periodically detect the electrical signal to detect the fingerprint of the user finger.

Specifically, in the technical solution of the implementation manners, the control module 221 may control the signal generation circuit 210 to periodically generate the drive signal by periodically sending the control signal, and then the control module 221 may periodically control the transducer module 222 to receive the drive signal to generate the ultrasonic signal, and the transducer module 222 may periodically receive the echo signal generated by reflecting the ultrasonic signal via the user finger under the control of the control module 221, and convert the periodically received echo signal into the corresponding electrical signal. Further, the control module 221 may also control the detection module 223 to periodically receive and detect the electrical signal, so as to realize the fingerprint detection of the user finger.

Optionally, the period of the control signal sent by the control module 221 to the signal generation circuit 210 may be determined according to a chip structure and a data processing speed of the ultrasonic fingerprint sensor chip 220. The sending period cannot be too long, otherwise fingerprint detection efficiency of the ultrasonic fingerprint sensor chip 220 will be affected. And the sending period cannot be too short, and needs to be longer than processing time for the ultrasonic fingerprint sensor chip 220 to generate the ultrasonic signal and receive the echo signal. Generally speaking, the sending period is usually less than 10 μs, and does not exceed 50 μs.

Through the technical solution of the implementation manners, the control module 221 may periodically send the control signal to the signal generation circuit 210 to realize the convenient control of the signal generation circuit 210, and the control module 221 may also periodically control the transducer module 222 and the detection module 223 to realize the periodic detection of the user fingerprint by the ultrasonic fingerprint sensor chip 220.

Figure 11:
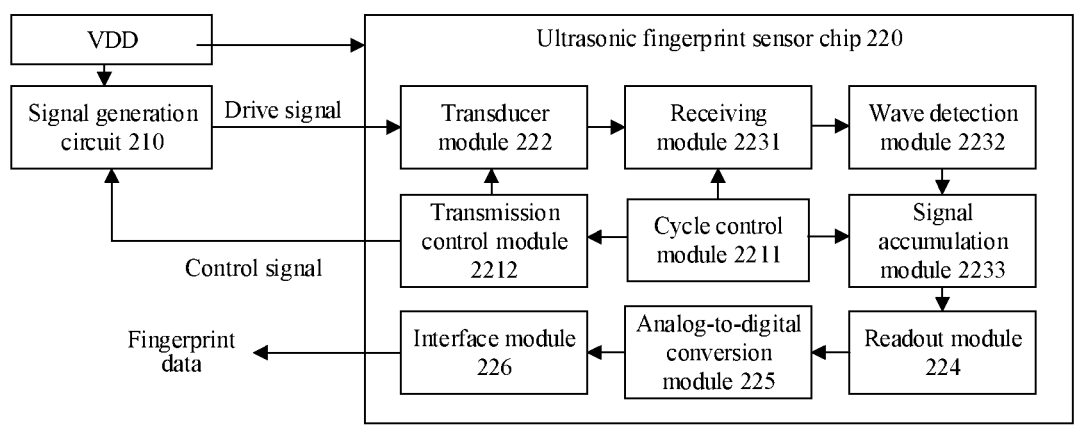
FIG. 11 is a schematic structural block diagram of another ultrasonic fingerprint sensor chip provided by an embodiment of the present application.

FIG. 11 shows a schematic structural block diagram of another ultrasonic fingerprint sensor chip 220 provided by an embodiment of the present application.

As shown in FIG. 11, in the embodiment of the present application, the above detection module 223 (not shown in FIG. 11) may include: a receiving module 2231, a wave detection module 2232 and a signal accumulation module 2233. The receiving module 2231 is configured to receive the plurality of electrical signals. The wave detection module 2232 is configured to detect amplitudes of the plurality of electrical signals. The signal accumulation module 2233 is configured to accumulate the amplitudes of the plurality of electrical signals to obtain a signal accumulation value, and the signal accumulation value is used to be averaged to detect the fingerprint of the user finger.

Specifically, in the implementation manners, the detection module 223 may include a plurality of sub-modules to realize detection of the electrical signal corresponding to the echo signal. The detection module 223 may include the signal accumulation module 2233, and the signal accumulation module 2233 may be configured to accumulate the amplitudes of the plurality of electrical signals detected by the wave detection module 2232 to obtain the signal accumulation value. After the signal accumulation value is averaged, noise in the signal can be reduced, thereby improving a signal-to-noise ratio (SNR) of fingerprint detection, and further improving fingerprint detection accuracy of the ultrasonic fingerprint sensor chip 220.

As an example, the control module 221 is configured to control the signal generation circuit 210 and the ultrasonic fingerprint sensor chip 220 to perform detection on the user fingerprint for a number of N times, the detection module 223 may receive N electrical signals, and the signal accumulation module 2233 accumulates amplitudes of the N electrical signals to obtain a signal accumulation value. Through the signal accumulation value, theoretically, the SNR of fingerprint detection can be increased by sqrt(N) times. For example, when N=100, the SNR of fingerprint detection can be increased by 10 times.

Optionally, the signal accumulation module 2233 may be an analog signal accumulator, that is, the signal accumulation module 2233 is configured to receive and accumulate a plurality of analog electrical signals, and the signal accumulation value output is also an analog signal value. The analog signal accumulation value can be quickly stored in the signal accumulation module 2233 without analog-to-digital conversion. Therefore, a circuit structure of the signal accumulation module 2233 is relatively simple, which can reduce circuit complexity of the ultrasonic fingerprint sensor chip 220.

Specifically, the signal accumulation module 2233 may be an integrator, and the wave detection module 2232 may be a wave detector. As an example, the whole of the wave detection module 2232 and the signal accumulation module 2233 may be an integral wave detector. Of course, in other alternative implementation manners, the signal accumulation module 2233 and the wave detection module 2232 may also be other types of circuit structures or devices, which are not specifically limited in this embodiment of the present application.

Optionally, as shown in FIG. 11, in this embodiment, the ultrasonic fingerprint sensor chip 220 further includes: a readout module 224, an analog-to-digital conversion module 225 and an interface module 226. The readout module 224 is configured to read out the signal accumulation value generated by the above signal accumulation module 2233 to the analog-to-digital conversion module 225. The analog-to-digital conversion module 225 is configured to convert the signal accumulation value into a digital signal. The interface module 226 is configured to transmit the digital signal (shown as fingerprint data in FIG. 11) to an external device so that the digital signal is averaged to detect the fingerprint of the user finger.

Optionally, the readout module 224 may specifically be a readout circuit. The analog-to-digital conversion module 225 may be an analog-to-digital converter (ADC). The interface module 226 includes but is not limited to a serial peripheral interface (SPI) interface.

In the case that the signal accumulation module 2233 is an analog signal accumulator, the readout module 224, the analog-to-digital conversion module 225 and the interface module 226 are set in the ultrasonic fingerprint sensor chip 220, which can facilitate a digital signal corresponding to the signal accumulation value to be transmitted to an external device of the ultrasonic fingerprint sensor chip 220 to quickly detect the fingerprint of the user finger, so as to improve fingerprint detection efficiency.

Optionally, in some alternative implementation manners, the above readout module 224, analog-to-digital conversion module 225 and interface module 226 may not be integrated in the ultrasonic fingerprint sensor chip 220, but disposed outside the ultrasonic fingerprint sensor chip 220, so as to reduce installation space occupied by the ultrasonic fingerprint sensor chip 220.

Optionally, as shown in FIG. 11, in the embodiment of the present application, the above control module 221 (not shown in FIG. 11) may include: a cycle control module 2211 and a transmission control module 2212. The cycle control module 2211 may be understood as a main control module of the ultrasonic fingerprint sensor chip 220, and is connected to and controls the transmission control module 2212 and the above receiving module 2231 and the signal accumulation module 2233.

Specifically, the cycle control module 2211 may send the control signal to the signal generation circuit 210 through the transmission control module 2212. For example, the cycle control module 2211 may periodically send the control signal to the signal generation circuit 210 through the transmission control module 2212.

In addition, the cycle control module 2211 may control the receiving module 2231 to receive the electrical signal obtained by the transducer module 222 converting the echo signal, for example, the cycle control module 2211 may control the receiving module 2231 to periodically receive the electrical signal.

Furthermore, the cycle control module 2211 may also control the signal accumulation module 2233 to accumulate the amplitudes of the plurality of electrical signals detected by the wave detection module 2232.

Optionally, the transmission control module 2212 and the cycle control module 2211 may be two discrete controllers as shown in FIG. 11, or the transmission control module 2212 and the cycle control module 2211 may also be integrated into one controller.

Figure 12:
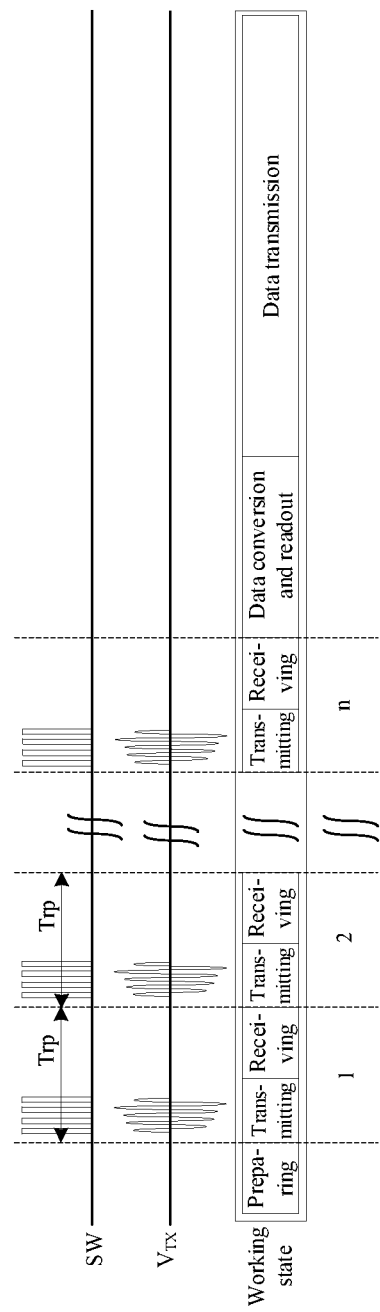
FIG. 12 is a schematic diagram of a working state of an ultrasonic fingerprint sensor chip provided by an embodiment of the present application.

In order to facilitate understanding of the above embodiments, FIG. 12 shows a schematic diagram of a working state of the ultrasonic fingerprint sensor chip 220 in the implementation manners shown in FIG. 11.

As shown in FIG. 12, the ultrasonic fingerprint sensor chip 220 may be in a periodic working state. In one period, the ultrasonic fingerprint sensor chip 220 may operate in a transmitting state and a receiving state respectively.

In the transmitting state, the ultrasonic fingerprint sensor chip 220 may send the control signal to the signal generation circuit 210 through the cycle control module 2211 and the transmission control module 2212, so that the signal generation circuit 210 periodically generates the excitation signal SW and the drive signal $V_{TX}$ under the action of the control signal.

Optionally, periods of the excitation signal SW and the drive signal $V_{TX}$ may be Trp, and the Trp may be the same as the period of the control signal sent by the control module 221 to the signal generation circuit 210. As mentioned above, the Trp may be determined according to the chip structure and the data processing speed of the ultrasonic fingerprint sensor chip 220. Generally speaking, the Trp is usually less than 10 μs, and does not exceed 50 μs.

In addition, in the transmitting state, the ultrasonic fingerprint sensor chip 220 may further send an ultrasonic signal to the user finger through the transducer module 222, so that the ultrasonic signal is reflected by the user finger to generate an echo signal.

In the receiving state, the ultrasonic fingerprint sensor chip 220 may convert the echo signal into an electrical signal through the transducer module 222, and the ultrasonic fingerprint sensor chip 220 may control the receiving module 2231, the wave detection module 2232 and the signal accumulation module 2233 through the cycle control module 2211 to receive and detect the electrical signal, and accumulate the electrical signal.

Through the cycle operation of n periods, the ultrasonic fingerprint sensor chip 220 can detect a signal accumulation value of n electrical signals, and the ultrasonic fingerprint sensor chip 220 can enter a data conversion and readout state, that is, the readout module 224 and the analog-to-digital conversion module 225 read out the signal accumulation value and performs analog-to-digital conversion. Next, the ultrasonic fingerprint sensor chip 220 can enter a data transmission stage, that is, transmitting a digital signal corresponding to the signal accumulation value to an external device through the interface module 226 so as to perform fingerprint detection.

Figure 13:
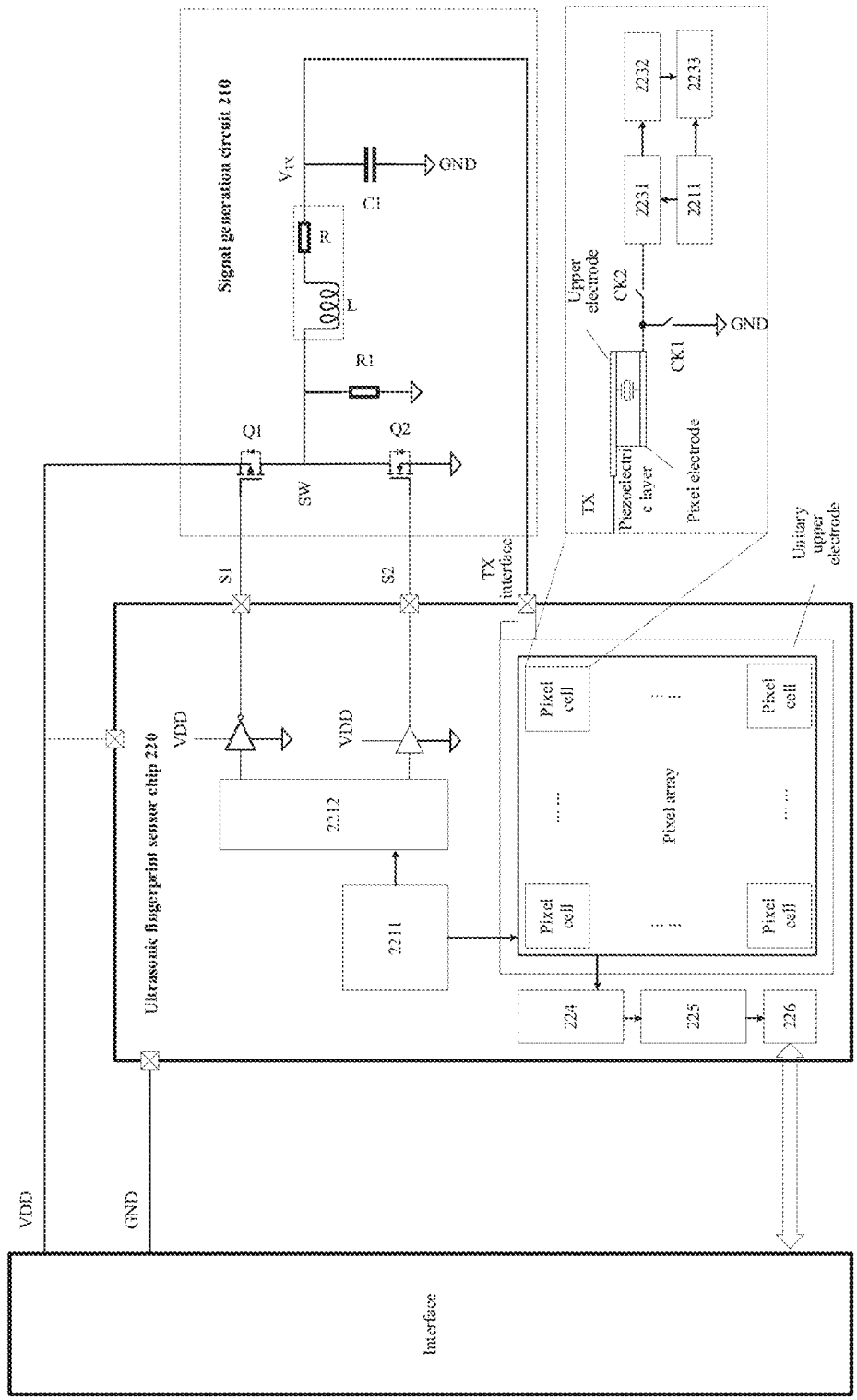
FIG. 13 is a schematic structural block diagram of another ultrasonic fingerprint detection device provided by an embodiment of the present application.

FIG. 13 shows a schematic structural block diagram of another ultrasonic fingerprint detection device 200 provided by an embodiment of the present application.

As shown in FIG. 13, in the embodiment of the present application, both an ultrasonic fingerprint sensor chip 220 and a signal generation circuit 210 receive a power supply voltage VDD output from the same interface.

For a specific implementation manner of the signal generation circuit 210, reference may be made to the technical solution of the above embodiment shown in FIG. 7. The capacitor C in the embodiment shown in FIG. 7 may include an adjustable capacitor C1 and an equivalent capacitor of an ultrasonic transducer in the ultrasonic fingerprint sensor chip 220 in the embodiment of the present application.

Optionally, the signal generation circuit 210 may receive two control signals S1 and S2 provided by the ultrasonic fingerprint sensor chip 220 to control two switching transistors Q1 and Q2 respectively. Alternatively, the signal generation circuit 210 may also receive one control signal provided by the ultrasonic fingerprint sensor chip 220, and the control signal is processed by other devices to form two control signals S1 and S2 for controlling two switching transistors Q1 and Q2 respectively.

Optionally, the two switching transistors Q1 and Q2 may be integrated into a driver for exciting a resonant circuit 212, and the driver may include other signal processing devices in addition to the two switching transistors Q1 and Q2. The specific structure of the driver is not limited in the embodiment of the present application.

As shown in FIG. 13, the specific structure of the ultrasonic fingerprint sensor chip 220 may be similar to that in the above embodiment shown in FIG. 11.

Specifically, the ultrasonic fingerprint sensor chip 220 may include a pixel array for performing ultrasonic fingerprint imaging, and the pixel array is composed of a plurality of pixel cells. Each pixel cell may include: an upper electrode, a piezoelectric layer, and a lower electrode. Upper electrodes of the plurality of pixel cells may be connected to each other to form a unitary upper electrode, and the unitary upper electrode may be electrically connected to a TX interface, and the TX interface may receive a drive signal $V_{TX}$ generated by the signal generation circuit 210.

Lower electrodes of the plurality of pixel cells may be arranged separately from each other, that is, the lower electrodes of the plurality of pixel cells may form a lower electrode array, and the plurality of lower electrodes in the lower electrode array have the same structure and are arranged on the same plane. The lower electrodes of the pixel cells may also be referred to as a pixel electrode. In each pixel cell, the combination of the upper electrode, the piezoelectric layer and the lower electrode may form an ultrasonic transducer unit, and a plurality of ultrasonic transducer units of the plurality of pixel cells may form an ultrasonic transducer (that is, the transducer module 222 described in the above embodiment) that can be configured to generate an ultrasonic signal under the action of the drive signal $V_{TX}$, and can also receive an echo signal corresponding to the ultrasonic signal to generate a corresponding electrical signal.

Continuing to refer to FIG. 13, in each pixel cell, the lower electrode is connected to ground through a first switch CK1 and connected to a receiving module 2231 through a second switch CK2.

When the signal generation circuit 210 outputs the drive signal $V_{TX}$, the first switch CK1 is turned on, and the transducer module 222 is in a transmitting state, and transmits ultrasonic waves. When the transmission ends, the first switch CK1 is turned off, and waits for a period of time to receive the echo signal. When the echo signal reaches the transducer module 222, the second switch CK2 is turned off, and the transducer module 222 converts the echo signal into an electrical signal. The electrical signal is transmitted to the receiving module 2231 and a wave detection module 2232 through the second switch CK2 for completing reception and wave detection of the echo signal, and is transmitted to a signal accumulation module 2233.

Optionally, the first switch CK1 and the second switch CK2 may be controlled by a cycle control module 2211 to control the operation state of the transducer module 222.

Optionally, in some implementation manners, one receiving module 2231 and one wave detection module 2232 may be configured correspondingly in each pixel cell. Alternatively, in some other implementation manners, the same receiving module 2231 and wave detection module 2232 may be configured for the ultrasonic transducer units of the plurality of pixel cells.

An embodiment of the present application further provides an electronic device including a cover plate and the ultrasonic fingerprint detection device 200 in any of the above embodiments. The cover plate is configured to provide a pressing interface of a user finger and receive pressing of the user finger. The ultrasonic fingerprint detection device 200 is disposed under the cover plate to detect a fingerprint of the user finger pressed against the cover plate.

In some possible implementation manners, the electronic device further includes a display screen. The cover plate is disposed above the display screen, and correspondingly, the ultrasonic fingerprint detection device 200 is disposed under the display screen, so as to realize an under-screen ultrasonic fingerprint recognition function of the electronic device.

It can be understood that, in the embodiment of the present application, an ultrasonic signal generated by the ultrasonic fingerprint detection device 200 can penetrate the display screen to reach the cover plate, and the ultrasonic signal can propagate at the cover plate and be reflected by the user finger pressed against the cover plate to form an echo signal, and the echo signal can penetrate the display screen and reach the ultrasonic fingerprint detection device 200 so that the ultrasonic fingerprint detection device 200 realizes a fingerprint detection function.

Optionally, the electronic device includes, but is not limited to, a mobile terminal device, such as a mobile phone, a notebook computer, and a tablet computer. It should be understood that the specific examples in the embodiments of the present application are only for helping those skilled in the art to better understand the embodiments of the present application, rather than limiting the scope of the embodiments of the present application.

For example, various specific technical features described in the above specific implementation manners can be combined in any suitable manner in the case of no contradiction. In order to avoid unnecessary repetition, additional description will no longer be given for various possible combination manners in the present application.

As another example, as long as various different implementation manners of the present application do not violate the idea of the present application, they can also be combined in any arbitrary manner, and should also be regarded as the content disclosed in the present application.

It should be understood that the terms used in the embodiments of the present application and the appended claims are only for the purpose of describing specific embodiments, and are not intended to limit the embodiments of the present application. For example, singular forms of "a", "an" and "the" used in the embodiments of the present application and the appended claims are also intended to include plural forms unless the context clearly indicates other meanings.

Those of ordinary skill in the art can be aware that units of each example described in conjunction with the embodiments disclosed herein can be implemented by electronic hardware, computer software, or a combination of the two. In order to clearly illustrate the interchangeability of hardware and software, components and steps of each example have been generally described according to functions in the above description. Whether these functions are executed by hardware or software depends on the specific application and design constraints of the technical solution. Those skilled in the art may use different methods to implement the described functions for each specific application, but such implementation should not be regarded as going beyond the scope of the present application.

In the several embodiments provided in the present application, it should be understood that the disclosed systems and devices can be implemented in other manners. For example, the device embodiments described above are only illustrative. For example, the division of modules is only a logical function division, and there may be other division methods in actual implementation. For example, a plurality of modules or components may be combined or may be integrated into another system, or some features may be ignored or not implemented. In addition, mutual coupling or direct coupling or communication connection shown or discussed may be indirect coupling or communication connection through some interfaces, devices or modules, and may also be electrical, mechanical or other forms of connection.

The above is only a specific implementation manner of the present application, but the scope of protection of the present application is not limited thereto. Any person familiar with the technical field can easily think of various equivalent modifications or replacements within the scope of the technology disclosed in the present application, and these modifications or replacements shall be covered within the scope of protection of the present application. Therefore, the scope of protection of the present application should be based on the scope of protection of the claims.

What is claimed is:

1. An ultrasonic fingerprint detection device, comprising:
a signal generation circuit; and
an ultrasonic fingerprint sensor chip,
wherein:
the signal generation circuit is composed of discrete devices and the signal generation circuit comprises: a control circuit and a resonant circuit, the control circuit is configured to receive a control signal provided by the ultrasonic fingerprint sensor chip and generate an excitation signal under the action of the control signal, and the resonant circuit is configured to receive the excitation signal and form a drive signal under the action of the excitation signal; and
the ultrasonic fingerprint sensor chip is configured to receive the drive signal, and generate an ultrasonic signal for fingerprint detection under the action of the drive signal;
wherein the control circuit comprises two switching transistors connected in series between an input power supply and ground, and the two switching transistors are alternatively turned on under the action of the control signal to generate a pulse excitation signal;
the resonant circuit comprises a capacitor and an inductor connected in series between the control circuit and the ground, and the capacitor and the inductor resonate under the action of the pulse excitation signal to generate a sine wave drive signal; and
wherein the two switching transistors are also turned on alternately in reverse phase under the action of the control signal to generate a reverse phase pulse excitation signal, and the reverse phase pulse excitation signal is used to damp resonance of the resonant circuit to reduce resonance energy of the sine wave drive signal.

2. The ultrasonic fingerprint detection device according to claim 1, wherein a switching transistor of the two switching transistors connected to the input power supply is a PMOS transistor, and a switching transistor of the two switching transistors connected to the ground is an NMOS transistor.

3. The ultrasonic fingerprint detection device according to claim 1, wherein during a process of alternately turning on the two switching transistors, after a state of one of the two switching transistors is changed from turn-on to turn-off followed by a preset time, a state of the other of the two switching transistors is changed from turn-off to turn-on.

4. The ultrasonic fingerprint detection device according to claim 1, wherein the signal generation circuit further comprises: a brake circuit comprising a damping resistor that is connected between the resonant circuit and the control circuit.

5. The ultrasonic fingerprint detection device according to claim 4, wherein one end of the damping resistor is connected between the resonant circuit and the control circuit, and the other end of the damping resistor is grounded.

6. The ultrasonic fingerprint detection device according to claim 5, wherein when the control circuit is disconnected, the damping resistor is connected in series between the resonant circuit and ground, and the damping resistor is configured to damp resonance of the resonant circuit to reduce resonance energy of the drive signal.

7. The ultrasonic fingerprint detection device according to claim 5, wherein a resistance value of the damping resistor is between $0.8*Z$ and $2*Z$, where $Z$ is a characteristic impedance of the resonant circuit.

8. The ultrasonic fingerprint detection device according to claim 1, wherein:
the ultrasonic fingerprint sensor chip comprises: a control module, a transducer module and a detection module;
the control module is configured to provide the control signal to the signal generation circuit to control the signal generation circuit to generate the drive signal;
the transducer module is configured to receive the drive signal to generate an ultrasonic signal, and the ultrasonic signal is reflected by a user finger to generate an echo signal, and the transducer module is configured to convert the echo signal into an electrical signal; and
the detection module is configured to detect the electrical signal to detect a fingerprint of the user finger.

9. The ultrasonic fingerprint detection device according to claim 8, wherein:
the control module is configured to send the control signal to the signal generation circuit multiple times to control the signal generation circuit to generate a plurality of drive signals;
the transducer module is configured to receive the plurality of drive signals to generate a plurality of ultrasonic signals, and convert a plurality of echo signals corresponding to the plurality of ultrasonic signals into a plurality of electrical signals; and the detection module is configured to detect the plurality of electrical signals to detect the fingerprint of the user finger.

10. The ultrasonic fingerprint detection device according to claim 8, wherein:
the control module is configured to periodically send the control signal to the signal generation circuit to control the signal generation circuit to periodically generate the drive signal;
the control module is configured to control the transducer module to periodically receive the drive signal to generate the ultrasonic signal; and
the control module is configured to control the detection module to periodically detect the electrical signal to detect the fingerprint of the user finger.

11. The ultrasonic fingerprint detection device according to claim 9, wherein:
the detection module comprises: a receiving module, a wave detection module and a signal accumulation module;
the receiving module is configured to receive the plurality of electrical signals;
the wave detection module is configured to detect amplitudes of the plurality of electrical signals; and
the signal accumulation module is configured to accumulate the amplitudes of the plurality of the electrical signals to obtain a signal accumulation value, and the signal accumulation value is used to be averaged to detect the fingerprint of the user finger.

12. The ultrasonic fingerprint detection device according to claim 11, wherein the signal accumulation module is an analog accumulator.

13. The ultrasonic fingerprint detection device according to claim 12, wherein:
the ultrasonic fingerprint sensor chip further comprises: a readout module, an analog-to-digital conversion module and an interface module;
the readout module is configured to read out the signal accumulation value to the analog-to-digital conversion module;
the analog-to-digital conversion module is configured to convert the signal accumulation value into a digital signal; and
the interface module is configured to transmit the digital signal to an external device so that the digital signal is averaged to detect the fingerprint of the user finger.

14. The ultrasonic fingerprint detection device according to claim 1, wherein a voltage value of an input power supply of the signal generation circuit is the same as a voltage value of an input power supply of the ultrasonic fingerprint sensor chip.

15. The ultrasonic fingerprint detection device according to claim 1, wherein a voltage value of an input power supply of the signal generation circuit and a voltage value of an input power supply of the ultrasonic fingerprint sensor chip are between 3V and 4.5V.

16. An electronic device, comprising:
a cover plate, and
an ultrasonic fingerprint detection device, comprising: a signal generation circuit and an ultrasonic fingerprint sensor chip,
wherein the signal generation circuit is composed of discrete devices and the signal generation circuit comprises: a control circuit and a resonant circuit, the control circuit is configured to receive a control signal provided by the ultrasonic fingerprint sensor chip and generate an excitation signal under the action of the control signal, and the resonant circuit is configured to receive the excitation signal and form a drive signal under the action of the excitation signal;
wherein the ultrasonic fingerprint sensor chip is configured to receive the drive signal, and generate an ultrasonic signal for fingerprint detection under the action of the drive signal;
wherein the cover plate is configured to receive pressing of a user finger, and the ultrasonic fingerprint detection device is disposed under the cover plate to detect a fingerprint of the user finger pressed against the cover plate;
wherein the control circuit comprises two switching transistors connected in series between an input power supply and ground, and the two switching transistors are alternatively turned on under the action of the control signal to generate a pulse excitation signal;
the resonant circuit comprises a capacitor and an inductor connected in series between the control circuit and the ground, and the capacitor and the inductor resonate under the action of the pulse excitation signal to generate a sine wave drive signal; and
wherein the two switching transistors are also turned on alternately in reverse phase under the action of the control signal to generate a reverse phase pulse excitation signal, and the reverse phase pulse excitation signal is used to damp resonance of the resonant circuit to reduce resonance energy of the sine wave drive signal.

17. The electronic device according to claim 16, wherein the electronic device further comprises: a display screen, wherein the cover plate is disposed above the display screen, and the ultrasonic fingerprint detection device is disposed under the display screen.

* * * * *